United States Patent
Lee et al.

(10) Patent No.: US 11,138,080 B2
(45) Date of Patent: Oct. 5, 2021

(54) APPARATUS AND METHOD FOR REDUCING CELL DISTURB IN AN OPEN BLOCK OF A MEMORY SYSTEM DURING A RECOVERY PROCEDURE

(71) Applicant: SK hynix Inc., Gyeonggi-do (KR)

(72) Inventors: Jong-Min Lee, Seoul (KR); Jang-Hwan Jun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 7 days.

(21) Appl. No.: 16/702,055

(22) Filed: Dec. 3, 2019

(65) Prior Publication Data
US 2020/0310926 A1 Oct. 1, 2020

(30) Foreign Application Priority Data
Mar. 27, 2019 (KR) .................. 10-2019-0035008

(51) Int. Cl.
| | | |
|---|---|---|
| G06F 11/14 | (2006.01) | |
| G06F 11/30 | (2006.01) | |
| G06F 12/02 | (2006.01) | |
| G11C 11/4074 | (2006.01) | |
| G06F 1/30 | (2006.01) | |
| G06F 3/06 | (2006.01) | |
| G06F 12/0882 | (2016.01) | |

(52) U.S. Cl.
CPC ............ *G06F 11/1489* (2013.01); *G06F 1/30* (2013.01); *G06F 3/0616* (2013.01); *G06F 3/0653* (2013.01); *G06F 3/0679* (2013.01); *G06F 11/1469* (2013.01); *G06F 11/3037* (2013.01); *G06F 12/0246* (2013.01); *G06F 12/0882* (2013.01); *G11C 11/4074* (2013.01)

(58) Field of Classification Search
None
See application file for complete search history.

(56) References Cited

U.S. PATENT DOCUMENTS

| | | | |
|---|---|---|---|
| 9,996,462 B1 * | 6/2018 | Lin | ............... G06F 12/0246 |
| 10,459,839 B1 * | 10/2019 | Pletka | ............... G06F 3/0608 |
| 10,776,264 B2 * | 9/2020 | Lin | ............... G06F 3/0679 |
| 2012/0159058 A1 * | 6/2012 | Yonezawa | ........... G06F 12/0246 |
| | | | 711/104 |

(Continued)

FOREIGN PATENT DOCUMENTS

| | | |
|---|---|---|
| KR | 10-2015-0039000 | 4/2015 |
| KR | 10-2015-0042652 | 4/2015 |

(Continued)

*Primary Examiner* — Kevin Verbrugge
(74) *Attorney, Agent, or Firm* — IP & T Group LLP

(57) ABSTRACT

A method for operating a memory system includes determining whether a recovery operation is performed, when power is supplied after being interrupted, generating an internal command for checking an operation status of a memory device when a recovery operation starts, accessing at least one open memory block in the memory device in response to the internal command, checking an operation status of the at least one open memory block, programming a preset amount of dummy data on a preset number of blank pages from a boundary programmed page in the at least one open memory block, and restoring data associated with the recovery operation in the at least one open block.

19 Claims, 8 Drawing Sheets

(56) References Cited

U.S. PATENT DOCUMENTS

| | | | |
|---|---|---|---|
| 2013/0067146 A1* | 3/2013 | Zettsu | G06F 12/0246 |
| | | | 711/103 |
| 2015/0006939 A1* | 1/2015 | Lim | G11C 5/148 |
| | | | 713/324 |
| 2015/0095558 A1* | 4/2015 | Kim | G11C 16/10 |
| | | | 711/103 |
| 2015/0127887 A1* | 5/2015 | Kim | G11C 5/143 |
| | | | 711/103 |
| 2015/0332770 A1* | 11/2015 | Kim | G11C 16/0483 |
| | | | 365/185.12 |
| 2016/0124820 A1* | 5/2016 | Lin | G06F 3/0679 |
| | | | 714/6.12 |
| 2017/0139784 A1* | 5/2017 | Ke | G06F 3/065 |
| 2017/0169883 A1* | 6/2017 | Kwon | G06F 3/064 |
| 2017/0228154 A1* | 8/2017 | Liu | G06F 11/1441 |
| 2018/0114570 A1* | 4/2018 | Lin | G11C 16/225 |
| 2018/0307496 A1* | 10/2018 | Ke | G06F 11/0757 |
| 2019/0196743 A1* | 6/2019 | Hsieh | G06F 3/0619 |
| 2019/0220392 A1* | 7/2019 | Lin | G06F 12/0246 |
| 2020/0233739 A1* | 7/2020 | Oh | G06F 3/0619 |

FOREIGN PATENT DOCUMENTS

| | | |
|---|---|---|
| KR | 10-2015-0130638 | 11/2015 |
| KR | 10-2017-0071126 | 6/2017 |

\* cited by examiner

APPARATUS AND METHOD FOR REDUCING CELL DISTURB IN AN OPEN BLOCK OF A MEMORY SYSTEM DURING A RECOVERY PROCEDURE

CROSS-REFERENCE TO RELATED APPLICATION

This patent application claims priority under 35 U.S.C. § 119 to Korean Patent Application No. 10-2019-0035008, filed on Mar. 27, 2019, the entire disclosure of which is incorporated herein by reference.

TECHNICAL FIELD

Various embodiments of the invention relate to a memory system, and more particularly, to a method and apparatus for reducing or avoiding occurrence of cell disturb in a specific nonvolatile memory block during a recovery operation of a memory system after a power failure.

BACKGROUND

Recently, a computer environment paradigm has shifted to ubiquitous computing, which enables a computer system to be accessed anytime and anywhere. Thus, the use of portable electronic devices such as mobile phones, digital cameras, notebook computers and the like is increasing. Such portable electronic devices typically use or include a memory system that uses or embeds at least one memory device, i.e., a data storage device. The data storage device can be used as a main storage device or an auxiliary storage device of a portable electronic device.

A data storage device used as a nonvolatile semiconductor memory device is advantageous in that it has excellent stability and durability because it has no mechanical driving part (e.g., a mechanical arm), has high data access speed, and low power consumption. Examples of such a data storage device include a USB (Universal Serial Bus) memory device, a memory card having various interfaces, and a solid state drive (SSD).

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
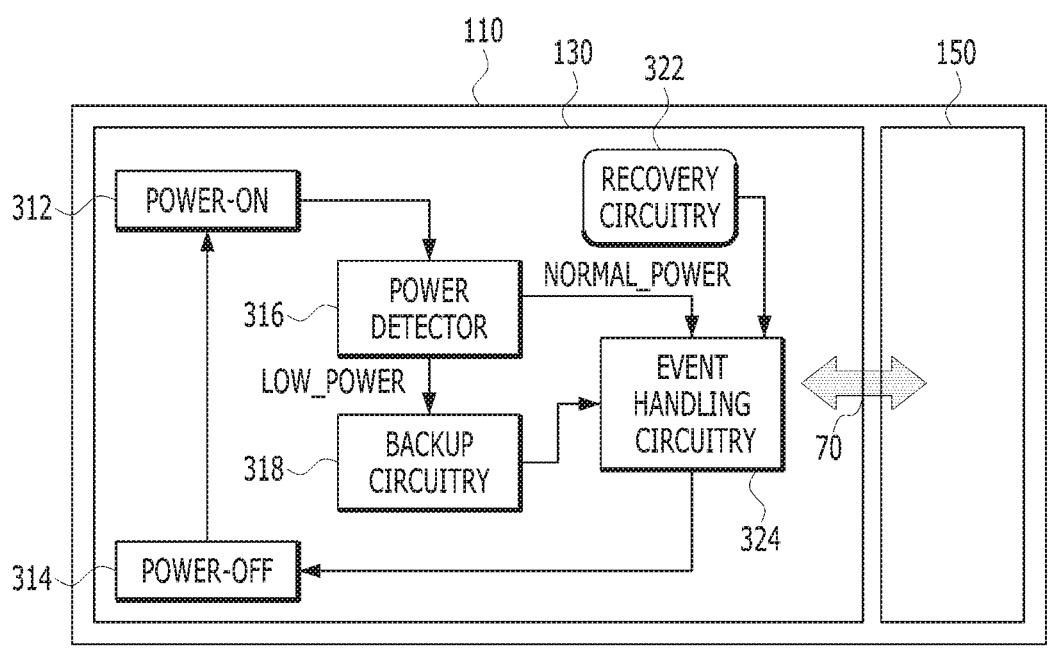
FIG. 1 is a block diagram illustrating an apparatus controlling a memory system in accordance with an embodiment of the disclosure.

Various examples of the disclosure are described below in more detail with reference to the accompanying drawings. Aspects and features of the present invention, however, may be embodied in different ways to form other embodiments, including variations of any of the disclosed embodiments. Thus, the invention is not to be construed as being limited to the embodiments set forth herein. Rather, the described embodiments are provided so that this disclosure is thorough and complete, and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

An embodiment of the disclosure can provide a memory system, a data processing system, and an operation process or a method, which can quickly and reliably process data into a memory device by reducing operational complexity and performance degradation of the memory system, thereby enhancing usage efficiency of the memory device.

In a case when power supplied into a memory system is unstable, the memory system may repeatedly perform an operation for checking a status of at least one open block in a memory device, so that disturbance in the at least one open block may be generated in a memory cell in which data is not programmed. An embodiment of the disclosure can provide a method and an apparatus for programming a preset amount of dummy data in the at least one open block, whenever the at least one open block is accessed, to reduce a possibility of errors caused by the disturbance when programming a new piece of data in the at least one open block the number of times.

Further, an embodiment of the disclosure can provide an apparatus and a method for reducing or avoiding repetitive accesses to a specific open block in an operating environment where a boot operation, a recovery operation or a reboot operation of a memory system may occur frequently, so that lifespan or durability of the memory system may be improved and operational stability of program operations in the memory system may be enhanced.

In an embodiment, a method for operating a memory system can include determining whether a recovery operation is performed, when power is supplied after being interrupted; generating an internal command for checking an operation status of a memory device when a recovery operation starts; accessing at least one open memory block in the memory device in response to the internal command; checking an operation status of the at least one open memory block; programming a preset amount of dummy data on a preset number of blank pages from a boundary programmed page in the at least one open memory block; and restoring data associated with the recovery operation in the at least one open block.

The accessing the at least one open memory block can include searching for the at least one memory block based on a log; supplying a read voltage to at least one page programmed with data in the at least one memory block; and outputting the data stored in the at least one page.

The accessing the at least one open memory block can further includes adjusting a level of the read voltage based on the outputted data.

The read voltage can be supplied sequentially or randomly to the at least one page, or supplied individually to a preset number of pages in the at least one open memory block.

By way of example but not limitation, the boundary programmed page can be the last programmed page in the at least one open memory block. The blank page is a page, which is erased and not programmed after being erased, in the at least one open memory block.

When a portion of the preset amount of dummy data is programmed on the last page of the at least one open memory block and all of the preset amount of dummy data is not programmed, a remaining portion of the preset amount of dummy data is not programmed on another memory block.

The preset amount of dummy data can be programmed on the preset number of blank pages which ranges between 10% and 50% of total pages in the at least one open memory block.

The checking the operation status of the at least one open memory block can include searching for the boundary programmed page without scanning the first page to the boundary programmed page of the at least one open memory block.

The method can further include, when the dummy data is programmed on the last page of the at least open memory block, changing the at least one open block into a closed memory block; and designating at least one free memory block as a new open block which the closed memory block is superseded by.

In another embodiment, a memory system can include a memory device including plural non-volatile memory blocks; and a controller configured to determine whether to perform a recovery operation corresponding to a power interruption when power is supplied. After the recovery operation starts, the controller can be configured to access at least one open memory block among the plural non-volatile memory blocks, program a preset amount of dummy data on a preset number of blank pages from a boundary programmed page in the at least one open memory block, and restore data associated with the recovery operation in the at least one open block.

The controller can be configured to generate an internal command for checking an operation status of the memory device within a preset time after the power is supplied.

The controller can be configured to search for the at least one memory block based on a log. The memory device can be configured to supply a read voltage to at least one page programmed with data in the at least one memory block, in response to the internal command, and output the data stored in the at least one page.

The controller can be configured to adjust a level of the read voltage based on the outputted data.

The read voltage can be supplied sequentially or randomly to the at least one page, or supplied individually to a preset number of pages in the at least one open memory block.

The boundary programmed page can be the last programmed page in the at least one open memory block. The blank page can be a page, which is erased and not programmed after being erased, in the at least one open memory block.

When a portion of the preset amount of dummy data is programmed the last page of the at least one open memory block and all of the preset amount of dummy data is not programmed, a remaining portion of the preset amount of dummy data is not programmed on another memory block.

The preset amount of dummy data can be programmed on the preset number of blank pages which ranges between 10% and 50% of total pages in the at least one open memory block.

The controller can be configured to, when the dummy data is programmed on the last page of the at least open memory block, change the at least one open block into a closed memory block, and designate at least one free memory block as a new open block which the closed memory block is superseded by.

In another embodiment, a method for operating a memory system can include checking an operation status of at least one open memory block in a memory device when power is supplied; and determining whether to use the at least one open memory block based on the operation status. The checking the operation status can include accessing the at least one open memory block in the memory device; searching for a boundary programmed page in the at least one open memory block; and programming a preset amount of dummy data on a preset number of blank pages from the boundary programmed page in the at least one open memory block.

The method can further include, when the dummy data is programmed on the last page of the at least open memory block, changing the at least one open block into a closed memory block; and designating at least one free memory block as a new open block which the closed memory block is superseded by.

In an embodiment, a memory system can include a memory device including a plurality of non-volatile memory blocks; and a controller configured to allocate at least one open memory block for a program operation and check an operational status of the at least one open memory block. The controller can be configured to program a preset amount of dummy data in the at least one open memory block when checking the operational status of the at least one open memory block.

Embodiments of the disclosure are described in detail below with reference to the accompanying drawings, wherein like numbers reference like elements.

In FIG. 1, a memory system 10, in accordance with an embodiment of the disclosure, includes a controller 130 and a memory device 150. The memory system 110 may be engaged with another device, e.g., a computing device.

The memory device 150 may include a plurality of nonvolatile memory blocks. A nonvolatile memory block may have a structure in which a plurality of nonvolatile memory cells can be coupled through word lines, bit lines, and the like. When a plurality of memory blocks in the memory device 150 are implemented as a type of nonvolatile memory, a memory block capable of storing data may not support a data overwrite operation. Therefore, if any piece of data is not recorded in at least some part of a memory block, a piece of new data can be programmed in the at least some part of the memory block. However, when pieces of data are written on all pages in a specific memory block, another piece of data cannot be stored or programmed in that memory block before the pieces of data stored in that memory block are erased.

In addition, the plurality of nonvolatile memory blocks may be divided into a plurality of regions. By way of example but not limitation, the memory device 150 may be divided into a system region storing system information and a data region storing user data. The system region may not be directly accessible to a user. A nonvolatile memory block included in the system region may store firmware, map information, logs, history information and the like. On the other hand, another nonvolatile memory block included in the data area may store user data which may be inputted by a user, or from a host, or outputted in response to a user's request or a host's request. According to an embodiment, some system information may be stored with the corresponding user data in the same nonvolatile memory block.

In an embodiment, the logs or the history information stored in the system area may be stored in a preset location or a position of the plurality of nonvolatile memory blocks included in the system region, while the user data stored in the data area is sequentially stored in the plurality of nonvolatile memory blocks of the data region. The system region and the data region may be controlled in different ways. The system area and the data area may not be mixed or overlapped so that the system area and the data area are stored in different memory blocks individually. However, according to an embodiment, a memory block may be re-allocated for the system region or the data region after all of the data stored in the memory block is erased.

The controller 130 may program or store a new piece of data, or read or erase a piece of data stored in the memory device 150. The controller 130 may support a data input/output (I/O) operation such as programming, reading and/or erasing data. Further, the controller 130 may monitor power supplied to the memory system 110 and perform a preset operation corresponding to a situation when the power is not normally supplied.

Figure 4:
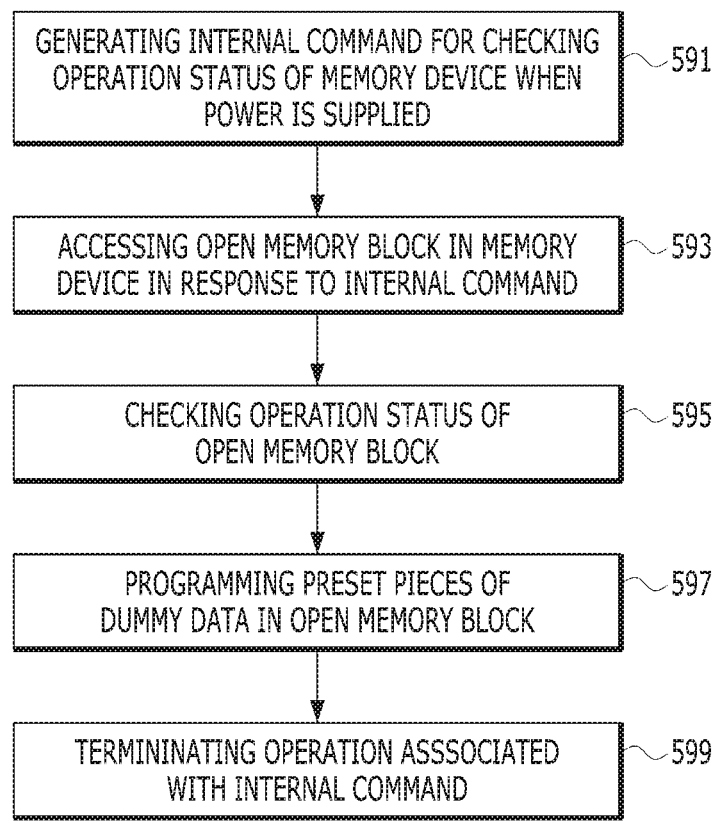
FIG. 4 is a diagram illustrating an operation method of a memory system in accordance with an embodiment of the disclosure.

In an embodiment, the controller 130 may detect power-on 312 and power-off 314. Referring to FIG. 4, a power detector 316 in the controller 130 may check or monitor whether the power supplied to the controller 130 is lower than a preset level. Here, the preset level may be a minimum level required for stable operation within the memory system 110. When the power supplied to the memory system 110 is higher than the preset level, the power detector 316 may recognize that the supplied power is stable. The power detector 316 may output a normal power status NORMAL_POWER as a monitoring result, when the supplied power is stably. On the other hand, when the power is lower than the preset level or the power is not supplied, the power detector 316 may determine that the supplied power is unstable and, output an abnormal power state LOW_POWER.

In the embodiment described with reference to FIG. 1, the controller 130 includes the power detector 316. But, according to another embodiment, the power detector 316 may be arranged outside the controller 130.

While power is supplied, a command, a piece of data and the like may be delivered to the memory system 110 from another device (e.g., a host, etc.). However, when the power is suddenly interrupted (e.g., sudden power-off, SPO) so that the power is not sufficiently supplied, the memory system 110 may not perform a data input/output (I/O) operation normally. When the power is cut off while the memory system 110 performs an operation corresponding to a command, data and etc. which was inputted from another device, the operation performed by the memory system 110 may be stopped or halted.

To enhance or improve reliability in operational engagement with another device, when the power is resumed (i.e., supplied again) after the operation performed in the memory system 110 is stopped or halted because of sudden power-off (SPO), it might be necessary that the memory system 110 restores to a previous status before the power is suddenly interrupted. When the memory system 110 does not revert to the previous status before the power is interrupted, some operations such as storing data required by a user or a host may disappear without a trace.

The memory system 110 may sequentially record or store an event or the like corresponding to an operation requested from another device. For example, a plurality of events corresponding to inputted requests or commands may be stored in a data structure such as a queue, and the plurality of events can be handled or processed by event handling circuitry 324.

As used in the disclosure, the term 'circuitry' can refer to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to a particular claim element, an integrated circuit for a storage device.

When it might be expected or monitored that the power is not supplied or the power is not stably supplied, the memory system 110 may prepare to store information about a situation before the power is halted or stopped, so as to perform a recovery operation after the power is supplied again or resumed. According to an embodiment, as not shown in FIG. 1, the memory system 110 may use reserved power for this operation. Such information for the recovery operation may include a log or history information. The log or the history information may include a plurality of events which can be stored in a data structure such as a queue. The plurality of events may include a first task that has been running when the power is interrupted, a second task to be scheduled, and a third task that had already been executed but its response has not answered yet to another device (e.g., a host). In order to improve or ensure operational reliability between the memory system 110 and another device and avoid a superfluous operation, the memory system 110 may store the third task in the log or the history information.

In an embodiment, the log or the history information may be configured by backup circuitry 318. For example, when receiving the abnormal power state LOW_POWER from the power detector 316, the backup circuitry 318 may use an electric energy stored in an auxiliary device to generate the log or the history information. Although not shown, the auxiliary device may include a capacitor or the like, which is capable of preserving a minimal electrical energy used by the backup circuitry 318 and the event handling circuitry 324 involved in preparation for a recovery operation.

When the backup circuitry 318 generates the log or the history information, the event handling circuitry 324 is configured to store the log or the history information in the memory device 150. After the event handling circuitry 324 stores the log or the history information in the memory device 150, the memory system 110 may be in the power-off 314.

Figure 2:
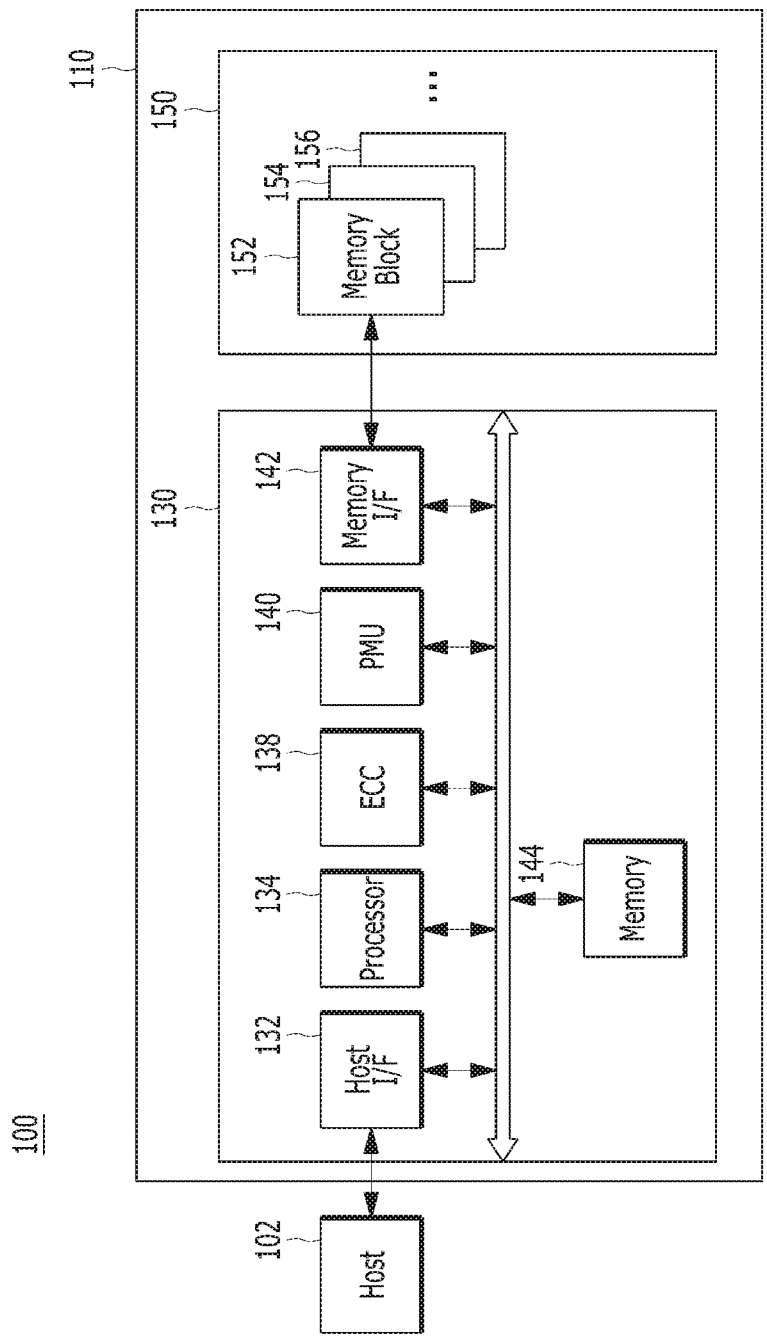
FIG. 2 is a block diagram illustrating a data processing system including a memory system in accordance with an embodiment of the disclosure.
Figure 3:
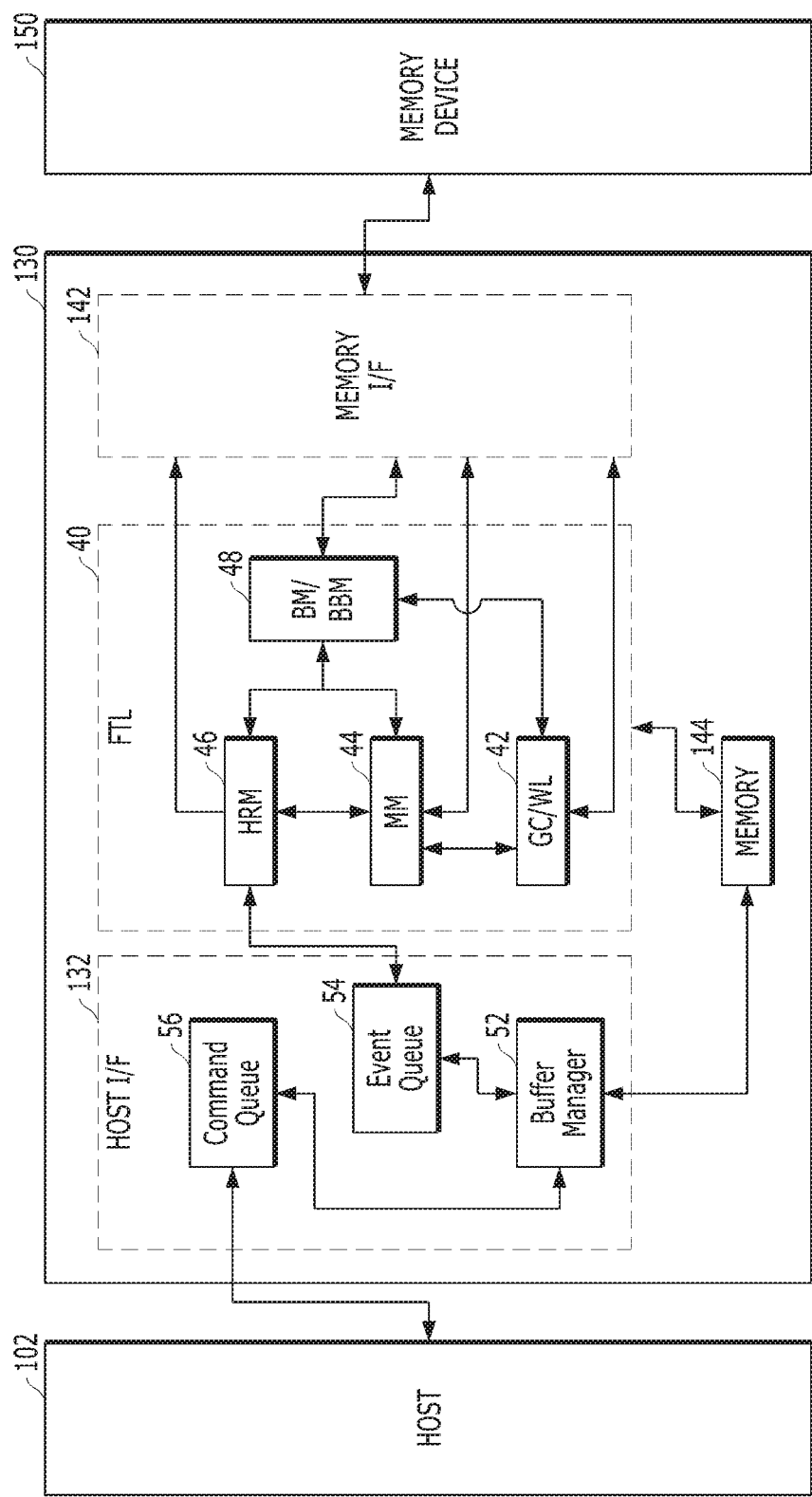
FIG. 3 is a block diagram illustrating a memory system in accordance with an embodiment of the disclosure.

When the power is resumed after being interrupted, the controller 130 may load system information such as firmware and map information stored in the memory device 150 into a memory 144 shown in FIGS. 2 and 3, and transfer the log or the history information, stored before the power is interrupted or halted, from the memory device 150.

For example, when the memory system 110 is diverted from the power-off 314 to the power-on 312, recovery circuitry 322 in the controller 130 may load the log or the history information stored in the memory device 150 through the event handling circuitry 324 and store the log or the history information into the memory 144. The event handling circuitry 324 may sequentially perform events stored in the log or the history information so that the memory system 110 may be restored, i.e., turned back to an operational status before the power is interrupted.

Furthermore, the event handling circuitry 324 may perform a method for checking an operational status regarding at least one open memory block shown in FIG. 4. The operational status of the at least one open block included in the memory device 150 may be checked, and a preset amount of dummy data may be programmed in the corresponding open block.

According to an embodiment, the backup circuitry 318 and the recovery circuitry 322 may be implemented with a logic circuit or a program algorithm. By way of example but not limitation, the backup circuitry 318 and the recovery circuitry 322 may be included in system firmware when implemented with a program algorithm. The operations of the backup circuitry 318 and the recovery circuitry 322 may be automatically performed whenever the supplied power is interrupted and an operation of the memory system 110 is abnormally halted. When the power is stopped after the memory system 110 has normally processed all events corresponding to operations requested or scheduled, the recovery circuitry 322 may not perform a recovery operation.

For example, it may be assumed that supplied power is unstable in an operating environment of the memory system 110. As an example of an unstable operating environment, power is not sufficiently supplied, or a power supply device works abnormally or unstably in a computing device or a data processing system in which the memory system 110 is mounted. In these cases, the memory system 110 may repeatedly perform the recovery operation whenever the power is supplied again or resumed. Each time a recovery operation is repeatedly performed, the controller 130 can perform an operation for checking an operational status of at least one open block included in the memory device 150. After checking the operational status of the at least one open block included in the memory device 150, a preset amount of dummy data may be programmed in the corresponding open block to avoid excessively repetitive accesses to the corresponding open block.

The recovery operation performs an event included in the logs or the history information. If the recovery operation is repeated, the same task may be repeatedly performed. Some repeated executions of the same task may not cause problems for the memory system 110. But, when a task included in the log or the history information requires access to a specific memory block in the memory device 150, the specific memory block may have been repeatedly accessed by the controller 130 for the recovery operation, so that characteristics or properties of the specific memory block, which may be shown as a read count or an erase count, may be deteriorated. For example, if the power is unstable and the recovery operations are repeatedly performed, it is highly probable that an operation for accessing a specific open memory block is also repeated. However, if a preset amount of dummy data is programmed in the specific open memory block whenever the recovery operation is performed, it is possible to reduce the number of repeated accesses regarding the specific open memory block because the specific open memory block is changed into a closed memory block, and another memory block is designated or allocated as a new open memory block which the closed memory block is superseded by.

Although FIG. 1 illustrates some components in the memory system for performing a recovery operation, the embodiments may be applicable to other components in the memory system for performing a boot operation. An operation for programming a preset amount of dummy data in at least one open memory block relating to the booting operation will be described later with reference to FIG. 6.

In FIG. 2, a data processing system 100 in accordance with an embodiment of the disclosure may include a host 102 engaged or operably coupled with a memory system 110.

The host 102 may include, for example, any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS can provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described below with reference to FIGS. 4 and 5.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be so integrated to form an SSD for improving operation speed. When the memory system 110 is used as an SSD, the operating speed of the host 102 connected to the memory system 110 can be improved more than that of the host 102 connected with a hard disk. In another embodiment, the controller 130 and the memory device 150 may be integrated into one semiconductor device to form a memory card, such as a PC card (PCMCIA), a compact flash card (CF), a smart media card (SM, SMC), a memory stick, a multimedia card (MMC, RS-MMC, MMC-micro), a SD card (SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) unit 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL).

The ECC unit 138 can correct error bits of the data to be processed in (e.g., outputted from) the memory device 150, which may include an ECC encoder and an ECC decoder. Here, the ECC encoder can perform error correction encoding of data to be programmed in the memory device 150 to generate encoded data into which a parity bit is added and store the encoded data in memory device 150. The ECC decoder can detect and correct errors contained in data read from the memory device 150 when the controller 130 reads the data stored in the memory device 150. In other words, after performing error correction decoding on the data read from the memory device 150, the ECC unit 138 can determine whether the error correction decoding has succeeded and output an instruction signal (e.g., a correction success signal or a correction fail signal). The ECC unit 138 can use the parity bit which is generated during the ECC encoding process, for correcting the error bit of the read data. When the number of the error bits is greater than or equal to a threshold number of correctable error bits, the ECC unit 138 may not correct error bits but instead may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all or some of circuits, modules, systems or devices for performing the error correction operation based on at least one of the above described codes.

The PMU 140 may manage electrical power provided in the controller 130. For example, the PMU 140 may detect the power-on 312 and the power-off 314 described in FIG. 1. In addition, according to an embodiment, the PMU 140 may include the power detector 316 shown in FIG. 1.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 can provide an interface for handling commands and data between the controller 130 and the memory device 150, for example, operations of NAND flash interface, in particular, operations between the controller 130 and the memory device 150. In accordance with an embodiment, the memory interface 142 can be implemented through firmware called a Flash Interface Layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 1 exemplifies the memory 144 disposed within the controller 130, the present invention is not limited to that arrangement. That is, the memory 144 may be within or external to the controller 130. For instance, the memory 144 may be embodied by an external volatile memory having a memory interface transferring data and/or signals between the memory 144 and the controller 130.

The memory 144 can store data necessary for performing operations such as data writing and data reading requested by the host 102 and/or data transfer between the memory device 150 and the controller 130 for background operations such as garbage collection and wear levelling as described above. In accordance with an embodiment, for supporting operations in the memory system 110, the memory 144 may include a program memory, a data memory, a write buffer/cache, a read buffer/cache, a data buffer/cache, a map buffer/cache, and the like.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be referred to as a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may otherwise function as a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programmed page) due to a characteristic of a flash memory device. Further, the controller 130 may store map data of the new data into the FTL.

For example, when performing an operation requested from the host 102 in the memory device 150, the controller 130 uses the processor 134 implemented as a microprocessor or central processing unit (CPU) or the like. The processor 134 engaged with the memory device 150 can handle instructions or commands corresponding to an inputted command from the host 102. The controller 130 can perform a foreground operation as a command operation, corresponding to an command inputted from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes an operation of copying and storing data in a memory block, among the memory blocks 152, 154, 156 in the memory device 150, to another memory block (e.g., a garbage collection (GC) operation). The background operation can include an operation to move or swap data stored in at least one of the memory blocks 152, 154, 156 in a memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 can determine which channel(s) or way(s) for connecting the controller 130 to which memory die(s) in the memory 150 is/are proper or appropriate for performing each operation. The controller 130 can send or transmit data or instructions via the determined channel(s) or way(s) for performing each operation. The plurality of memory dies can transmit an operation result via the same channel(s) or way(s), respectively, after each operation is complete. Then, the controller 130 may transmit a response or an acknowledge signal to the host 102. In an embodiment, the controller 130 can check a status of each channel or each way. In response to a command received from the host 102, the controller 130 may select at least one channel or way based on the status of each channel or each way so that instructions and/or operation results with data may be delivered via selected channel(s) or way(s).

By way of example but not limitation, the controller 130 can recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 can refer to descriptors delivered from the memory device 150. The descriptors can include a block or page of parameters that describe informative items about the memory device 150, which is a data with a set format or structure. For instance, the descriptors may include device descriptors, configuration descriptors, unit descriptors, and the like. The controller 130 can refer to, or use, the descriptors to determine which channel(s) or way(s) an instruction or a data is exchanged with.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Referring to FIG. 3, a controller in a memory system in accordance with another example of the disclosure is described in detail. The controller 130 cooperates with the host 102 and the memory device 150. The controller 130 can include a host interface 132, a flash translation layer (FTL) unit 240, a memory interface 142 and a memory 144.

Although not shown in FIG. 3, in accordance with an embodiment, the ECC unit 138 described in FIG. 2 may be included in the flash translation layer (FTL) unit 240. In another embodiment, the ECC unit 138 may be implemented as a separate module, a circuit, firmware or the like, which is included in, or associated with, the controller 130.

The host interface 132 is for handling commands, data, and the like transmitted from the host 102. By way of example but not limitation, the host interface 132 can include a command queue 56, a buffer manager 52 and an event queue 54. The command queue 56 can sequentially store commands, data, and the like transmitted from the host 102 and output them to the buffer manager 52 in a stored order. The buffer manager 52 can classify, manage or adjust the commands, the data, and the like, which are delivered from the command queue 56. The event queue 54 can sequentially transmit events for processing the commands, the data, and the like transmitted from the buffer manager 52.

A plurality of commands or data of the same characteristic may be continuously transmitted from the host 102, or commands and data of different characteristics may be transmitted to the memory system 110 after being mixed or jumbled. For example, a plurality of commands for reading data (read commands) may be delivered, or commands for reading data (read command) and programming/writing data (write command) may be alternately transmitted to the memory system 110. The host interface 132 can store commands, data, and the like, which are transmitted from the host 102, to the command queue 56 sequentially. Thereafter, the host interface 132 can estimate or predict what kind of internal operation the controller 130 will perform according to the characteristics of the command, data, etc., which is transmitted from the host 102. The host interface 132 can determine a processing order and a priority of commands, data and the like, based at least on their characteristics. According to characteristics of commands, data, and the like transmitted from the host 102, the buffer manager 52 in the host interface 132 is configured to determine whether the buffer manager should store commands, data, and the like in the memory 144, or whether the buffer manager should deliver the commands, the data, and the like into the flash translation layer (FTL) unit 240. The event queue 54 receives events, entered from the buffer manager 52, which are to be internally executed and processed by the memory system 110 or the controller 130 in response to the commands, the data, etc. transmitted from the host 102, to deliver the events into the flash translation layer (FTL) unit 240 in the order received.

In accordance with an embodiment, the host interface 132 described in FIG. 3 may perform the functions of the controller 130 described in FIG. 1.

In accordance with an embodiment, the flash translation layer (FTL) unit 240 can include a host request manager (HRM) 46, a map manager (MM) 44, a state manager 42 and a block manager 48. The host request manager (HRM) 46 can manage the events entered from the event queue 54. The map manager (MM) 44 can handle or control a map data. The state manager 42 can perform garbage collection or wear leveling. The block manager 48 can execute commands or instructions onto a block in the memory device 150.

By way of example but not limitation, the host request manager (HRM) 46 can use the map manager (MM) 44 and the block manager 48 to handle or process requests according to the read and program commands, and events which are delivered from the host interface 132. The host request manager (HRM) 46 can send an inquiry request to the map data manager (MM) 44, to determine a physical address corresponding to the logical address which is entered with the events. The host request manager (HRM) 46 can send a read request with the physical address to the memory interface 142, to process the read request (handle the events). On the other hand, the host request manager (HRM) 46 can send a program request (write request) to the block manager 48, to program entered data to an empty page (having no data) in the memory device 150, and then, can transmit a map update request corresponding to the program request to the map manager (MM) 44, to update an item relevant to the programmed data in information of mapping the logical-physical addresses to each other.

Here, the block manager 48 can convert a program request delivered from the host request manager (HRM) 46, the map data manager (MM) 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance or maximize parallel processing of the multi-channel and multi-directional flash controller.

On the other hand, the block manager 48 can be configured to manage blocks in the memory device 150 according to the number of valid pages, select and erase blocks having no valid pages when a free block is needed, and select a block including the least number of valid pages when it is determined that garbage collection is necessary. The state manager 42 can perform garbage collection to move the valid data to an empty block and erase remaining data in the blocks from which the valid data was moved so that the block manager 48 may have enough free blocks (empty blocks with no data). If the block manager 48 provides information regarding a block to be erased to the state manager 42, the state manager 42 is able to check all flash pages of the block to be erased to determine whether each page is valid. For example, to determine validity of each page, the state manager 42 can identify a logical address recorded in an out-of-band (OOB) area of each page. To determine whether each page is valid, the state manager 42 can compare the physical address of the page with the physical address mapped to the logical address obtained from the request. The state manager 42 sends a program request to the block manager 48 for each valid page. A mapping table can be updated through the update of the map manager 44 when the program operation is complete.

The map manager 44 can manage a logical-physical mapping table. The map manager 44 can process requests such as queries, updates, and the like, which are generated by the host request manager (HRM) 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request can be sent to the block manager 48 so that a clean cache block is made and the dirty map table may be stored in the memory device 150.

On the other hand, when garbage collection is performed, the state manager 42 copies valid page(s) into a free block, and the host request manager (HRM) 46 can program the latest version of the data for the same logical address of the page and currently issue an update request. When the status manager 42 requests the map update in a state in which copying of valid page(s) has not been completed, the map manager 44 may not perform the mapping table update. This is because the map request is issued with old physical information if the status manger 42 requests a map update and a valid page copy is not completed until later. The map manager 44 may perform a map update operation to ensure accuracy only if the latest map table still points to the old physical address.

In accordance with an embodiment, at least one of the state manager 42, the map manager 44 or the block manager 48 can include the operation information confirmation circuitry 124 shown in FIG. 1.

The memory device 150 can include a plurality of memory blocks. The plurality of memory blocks can be different types of memory blocks, such as a single level cell (SLC) memory block or a multi level cell (MLC) Cell) memory block, according to the number of bits that can be stored or represented in one memory cell of such block.

Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block and a combination thereof. The double level memory block may include a plurality of pages implemented by memory cells, each capable of storing 2-bit data. The triple level cell (TLC) memory block can include a plurality of pages implemented by memory cells, each capable of storing 3-bit data. The quadruple level cell (QLC) memory block can include a plurality of pages implemented by memory cells, each capable of storing 4-bit data. In another embodiment, the memory device 150 can be implemented with a block including a plurality of pages implemented by memory cells, each capable of storing 5-bit or more bit data.

In an embodiment of the disclosure, the memory device 150 is embodied as a nonvolatile memory such as a flash memory such as a NAND flash memory, a NOR flash memory and the like. In another embodiment, the memory device 150 may be implemented by at least one of a phase change random access memory (PCRAM), a ferroelectrics random access memory (FRAM), a spin injection magnetic memory (e.g., a spin transfer torque magnetic random access memory, STT-MRAM), or the like.

FIG. 4 is a diagram illustrating an operation method of a memory system in accordance with an embodiment of the disclosure.

Referring to FIG. 4, a method for operating a memory system may include generating an internal command for checking an operation status of a memory device when power is supplied (step 591), accessing at least one open memory block in the memory device in response to the internal command (step 593), checking an operation status of the at least one open memory block (step 595), programming preset pieces of dummy data in the at least one open memory block (step 597), and terminating an operation associated with the internal command (step 599).

When power is supplied to the memory system, the memory system may check an operation status regarding an internal configuration. For example, the memory system may include a memory device and a controller. The memory device may include a plurality of memory blocks including plural nonvolatile memory cells, and the controller may control an operation for storing data in the memory device or reading data stored in the memory device. An internal configuration of the memory system may refer to FIGS. 1 to 3. Herein, a memory block may include plural pages, each page including plural nonvolatile memory cells. The memory block may be considered a group of nonvolatile memory cells of which data is erased together, while the page may be considered a group of nonvolatile memory cells of which data is programmed together.

In an embodiment, an internal command may be generated during a booting operation that is automatically performed when power is supplied or resumes into the memory system. The memory system may include an algorithm for controlling an operation internally performed therein such as a boot sequence, and may check an operational status regarding a component in the memory system after the power is supplied to the memory system and before the memory system performs an operation, which is requested from a host operatively engaged with the memory system, such as a data input/output (I/O) operation.

Further, although not shown, the step of generating the internal command for checking the operation status of the memory device when power is supplied (step 591) can include determining whether to perform a recovery operation due to a sudden power off (SPO) and generating the internal command for checking an operation status of the memory block in the memory device when the recovery operation starts. When the memory system is abnormally terminated or the power is interrupted, the memory system may perform the recovery operation after the power resumes or is supplied again. The memory system may check an operation status of a component in the memory system while performing the recovery operation.

On the other hand, in another embodiment, the memory system may check an operation status regarding a component in response to a request or a command entered from another device (e.g., a host). For example, the component may include at least one open block. In addition, when the memory system exits a sleep mode for reducing power consumption (e.g., a hibernation mode), the operation status regarding the component may be checked.

Although not described above, operation statuses regarding the components included in the memory system may be checked in various environments or conditions. The checking step of the operation statuses of the components in the memory system may include checking the operation status of at least one open memory block among a plurality of memory blocks included in the memory device. The memory device may include at least one open block capable of programming a piece of data. Generally, an open memory block may include a memory block allocated or prepared for programming a new piece of data. Sometimes, pieces of data may have been programmed in the open memory block. The open memory block includes at least one blank page including nonvolatile memory cells which have been erased previously and not programmed yet. On the other hand, if plural pieces of data are programmed in all of the pages of the open memory block and the open memory block does not include any blank page, the open memory block may be diverted into a closed memory block. Here, the closed memory block indicates that a piece of data can no longer be programmed therein without an erase operation. After data is programmed on all pages of a specific memory block so that the specific memory block becomes closed, the memory block may be erased, when a time passes and the data stored in the memory block is no longer valid.

The memory system can be ready to program a new piece of data at any time, once powered on. Therefore, the memory system can check the operation status of the open memory block allocated for programming a new piece of data. One of the methods for checking the operation status of the open memory block is to access the open memory block and read data stored in the open memory block (see the step 593). If there is no error in the data read from the open memory block, the operation status of the open memory block may be good or normal (see the step 595). On the other hand, when there is an error in data read from the open memory block or when it is required to adjust a read voltage for reading data from the open memory block, it can be determined that an operation state of the open memory block is abnormal or bad (see the step 595). In this case, to improve operational stability of the memory system, the current open memory block may be replaced with another memory block.

Although not shown, the step for accessing at least one open memory block (step 593) may include searching for an open memory block based on a log, supplying a read voltage to at least one programmed page in the open memory block, and outputting data stored in the at least one programmed page. In addition, the step for accessing the at least one open memory block (step 593) may further include adjusting a level of the read voltage based on the outputted data to re-read the data stored in the at least one programmed page.

The step for determining the operation status regarding the open memory block (step 595) may include finding a boundary word line or a boundary page without sequentially scanning all pages in the open memory block. The open memory block may include a program region in which data has been programmed and a blank region in which data has been erased, among the first page and the last page. When the program region includes plural pages, pieces of data can be sequentially programmed from the first page to the boundary page of the open memory block. Herein, the boundary word line or the boundary page is the last page in which a piece of data is programmed. Further, the blank region in the open memory block may include at least one blank page, each corresponding to each word line. The blank page is a page including nonvolatile memory cells erased and not programmed yet.

According to an embodiment, although not shown, a method of operating a memory system may include programming a preset amount of dummy data on a preset number of pages from the boundary page in the open memory block, and restoring data corresponding to the recovery operation on a blank page of the open memory block after programming the preset amount of the dummy data. According to an embodiment, the preset number of pages (clean word lines) on which the dummy data is programmed may be determined to avoid read disturb which affects characteristics of blank pages in the open memory block. In another embodiment, the preset number of blank pages (clean word lines) may be determined as much as possible to reduce repetitive read operations for accessing the open memory block. For example, the preset number of pages is 1 or N pages (N is a positive integer larger than 1). According to an embodiment, the preset number of pages on which the dummy data is programmed may be determined based on a design/structure, a degree of integration, manufacturing characteristics, or the like of a memory block included in the memory device.

The memory system may record physical location information (access information) regarding at least one open memory block of the memory device in a log before power is off. When the power resumes or is supplied again, the memory system can check which memory block is an open memory block. When a read voltage is supplied to nonvolatile memory cells of pages in the open memory block, data stored in the nonvolatile memory cells of the open memory block can be outputted. According to an embodiment, the read voltage may be sequentially or randomly supplied to at least one page, or may be supplied to one of the preset number of pages.

In an environment where the power is unstably supplied, the memory system may repeatedly perform a booting operation or a recovery operation whenever the power resumes. If the power is on or off repeatedly while the memory system does not perform a program operation for storing any new piece of data in a specific open memory block, the memory system may repeatedly access the specific open memory block. When some data in the corresponding open memory block can be read repeatedly, read disturb may occur between data stored in the open memory block. In addition, repetitive access (repeated read operations) may cause disturbance in some nonvolatile memory cells, erased and not programmed yet, in the open memory block, so that the nonvolatile memory cells become in an unstable status (i.e., their threshold voltage can be changed). Erased memory cells in a page where a piece of data is not programmed may be more vulnerable to disturb than those in another page where a piece of data is programmed. Accordingly, repeatedly accessing the open memory block may destabilize the blank region of the open memory block, which a piece of data is not stored in.

Read disturb errors are an intrinsic result of the nonvolatile memory architecture. During a read operation to a nonvolatile memory cell, a read reference voltage is applied to the transistor corresponding to this cell. If this read reference voltage is higher than the threshold voltage of the cell, the transistor is turned on. Within a nonvolatile memory block, the transistors of multiple memory cells, each from a different flash page, are tied together as a single bit line, which is connected to a single output wire. Only a single memory cell is read at a time per bit line. In order to read a single memory cell (i.e., to determine whether it is turned on or off), the transistors for the memory cells not being read must be kept on to allow the value from the cell being read to propagate to the output. This requires the transistors to be powered with a passthrough voltage, which is a read reference voltage guaranteed to be higher than any stored threshold voltage. Though these other memory cells are not being read, this high passthrough voltage induces electric tunneling that can shift the threshold voltages of these unread cells to higher values, thereby disturbing the memory cell contents on a read operation to a neighboring page.

To avoid or reduce read disturb or disturbance, the memory system may program a preset amount of dummy data on at least one blank page in which any piece of data is not programmed (step 597) after accessing the open memory block to determine an operation status of the open memory block. The preset amount of dummy data may be programmed on at least one blank page in the open memory block. When a piece of dummy data is programmed on the last page of the open memory block, the memory system may not program dummy data in a new open memory block. When the preset amount of dummy data is programmed each time whenever the open memory block is accessed to determine the operation status of the open memory block, the number of accesses regarding the open memory block may be limited even if the open memory block is repeatedly accessed without any program operation for programming a new piece of data in the open memory block.

According to an embodiment, the preset amount of dummy data may be programmed on the preset number of pages corresponding to a range of 10 to 50% of the total pages in the open memory block. For example, the preset amount of dummy data may be determined according to how many accesses to an open memory block are allowed, i.e., the maximum number of accesses. In addition, when the dummy data is programmed on the last page of the open memory block, the operating method of the memory system may further include changing the open memory block into a closed memory block (i.e., a closed state) and designating at least one of new free memory blocks as a new open block which the closed memory block is superseded by.

By way of example but not limitation, the number of total pages in an open memory block is 100, and plural pieces of data are programmed from first to 20$^{th}$ pages in the open memory block. Thus, a blank region of the open memory block is from 21th pages to the last page. In addition, a preset amount of dummy data can be programmed on 30 pages at once. If the open memory block is accessed after the power resumes, it can be checked that plural pieces of data are programmed up to the 20$^{th}$ page of the open memory block. Further, when there is no error in data read between the first to the 20$^{th}$ pages in the open memory block, it can be determined that the open memory block is in a healthy state. Further, the preset amount of dummy data can be programmed in the following 30 pages, i.e., from 21th to 50th pages in the open memory block. Even if the memory system does not perform an operation of programming a new piece of data in the open memory block and the power is unstably interrupted, turned off and on, the dummy data is programmed up to the 50th page of the open memory block, the operation status of the open memory block is checked, and another dummy data is programmed on another 30 pages, i.e., from 51th to 80th pages in the open memory block. Thereafter, when the dummy data is programmed in the 51th to the 80th pages of the open memory block and the power is unstably interrupted, turned off and on, it may be checked that the dummy data is programmed up to the 80th page of the open memory block. After checking the operation status of the open memory block, another dummy data may be programmed in the remaining 20 pages, i.e., from 81th to 100th pages in the open memory block. In this case, the dummy data may not be programmed in a new open memory block when programmed on the last page of the previous open memory block. Even if the power is turned on again after the power is interrupted or halted, the previous open memory block that had been repeatedly accessed may be closed so that the previous open memory block may not be further accessed for the recovery operation or the boot operation.

Figure 5:
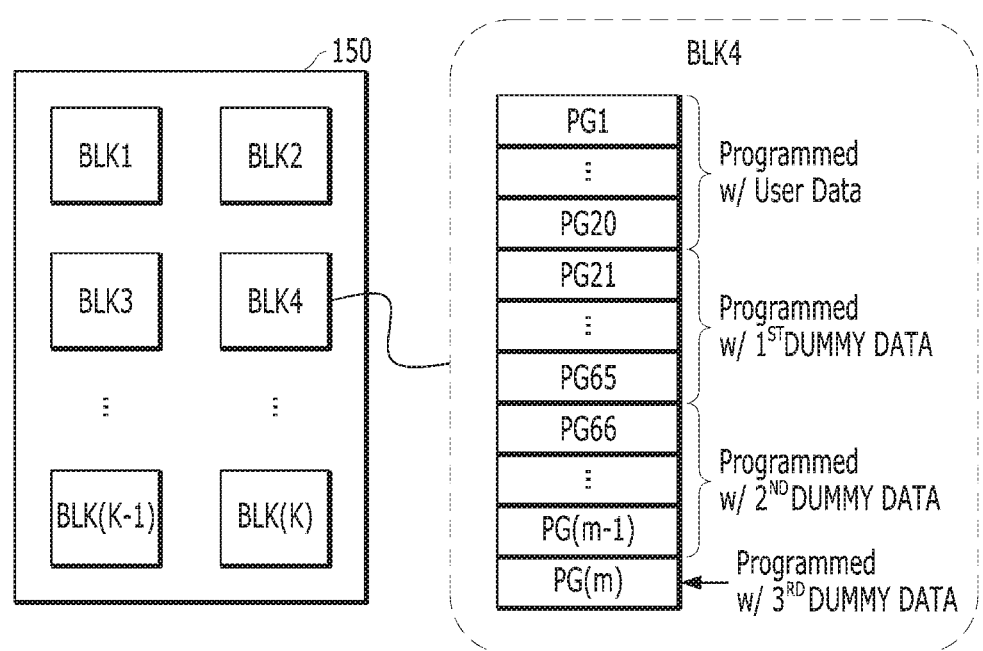
FIG. 5 is a diagram illustrating an operation for programming dummy data in a memory system in accordance with an embodiment of the disclosure.

FIG. 5 is a diagram illustrating an operation for programming dummy data in a memory system in accordance with an embodiment of the disclosure.

Referring to FIG. 5, a memory device 150 may include a plurality of memory blocks BLK1, BLK2, BLK3, BLK4, . . . , BLK(K−1), BLK(K). The plurality of memory blocks may be categorized as an open memory block, a closed memory block, a free memory block and the like. Herein, a fourth memory block BLK4 is a type of open memory block.

The fourth memory block BLK4 has m pages PG1 to PG(m). For example, user data is sequentially programmed from the first page to the twentieth page PG1 to PG20 in the fourth memory block BLK4, and the twenty-first page PG21 to the last page PG(m) may be blank, i.e., not programmed with any user data.

After power is supplied, the memory system can access to check the operation status of the fourth block BLK4, and then program the preset amount of first dummy data (1$^{st}$ DUMMY DATA) from the 21st page to a 65th page in the fourth memory block BLK4. Here, the first dummy data may be an amount that can be recorded on about 45 pages.

Further, a new piece of data is not programmed from a 66th page in the fourth memory block BLK4, and the power is interrupted or turned off and the power resumes or is turned on again. An operation status of the fourth memory block BLK4, which is an open memory block in the memory device 150, may be checked. In this case, user data or dummy data is programmed from the first page PG1 to the sixty-fifth page PG65 in the fourth memory block BLK4 which is an open memory block. After checking the operation state of the fourth memory block BLK4, the memory system may program second dummy data (2$^{nd}$ DUMMY DATA) from the 66th page in the fourth block BLK4.

According to an embodiment, a size of the second dummy data (2$^{nd}$ DUMMY DATA) may be the same as the size of the first dummy data. The second dummy data (2$^{nd}$ DUMMY DATA) may be programmed on 45 pages from the page 66 (e.g., up to a 110th page). For example, the total number of pages in the fourth block BLK4 s 111 (m=111). After the second dummy data (2nd Dummy Data) is programmed, the user data and the dummy data are stored in all pages except the last page. The last page PG(m) is blank.

If a new piece of data is not programmed in the fourth memory block BLK4, the power is turned off and the power is turned on again. When the operation status of the fourth memory block BLK4 is checked, it is recognized that the second dummy data (2$^{nd}$ DUMMY DATA) is programmed in the fourth memory block BLK4 that is still an open block because the last page PG(m) of the fourth memory block BLK4 is blank. After checking the operation status of the fourth memory block BLK4, third dummy data (3$^{rd}$ DUMMY DATA) may be programmed in the last page PG(m) of the fourth block BLK4. When the third dummy data (3$^{rd}$ DUMMY DATA) is programmed in the last page PG(m) of the fourth memory block BLK4, the fourth memory block BLK4 is switched to a closed state. Since the fourth memory block BLK4 is closed, i.e., no longer an open memory block, the fourth memory block BLK4 may not be accessed for checking a status of at least one open memory block even when the power is turned off and the power is turned on again.

In the above-described embodiment, sizes of the first to third dummy data are the same. However, even if the sizes of the first to third dummy data are the same, programming dummy data may be limited to available pages (or blank pages) of the open memory block if the number of remaining blank pages is smaller than the size of the first to third dummy data.

According to an embodiment, a size of dummy data programmed after the open memory block is accessed may be adjusted. For example, the size of the dummy data may be determined based on the number of pages obtained through adding a preset number of pages into a preset percentage (%) of blank pages in the open memory block. For example, when an open memory block includes 50 blank pages, the preset percentage is 50% and the preset number is 10, the size of the dummy data could be programmed on 35 pages among the 50 blank pages of the open memory block.

In addition, according to an embodiment, the maximum number of times the open memory block can be repeatedly accessed may be set, and the amount of dummy data is programmed once based on the number of pages obtained through dividing the number of total pages in the open memory block by the maximum number.

Figure 6:
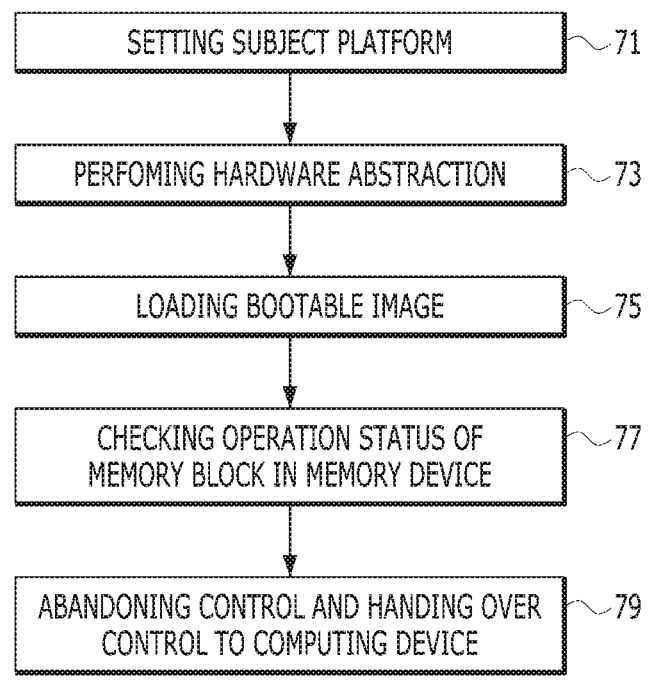
FIG. 6 is a diagram illustrating an operation executed by firmware of a memory system in accordance with an embodiment of the disclosure.

FIG. 6 is a diagram illustrating an operation executed by firmware of a memory system in accordance with an embodiment of the disclosure. Operation based on the firmware may vary depending on whether the memory system is mounted on a mobile device, a notebook computer, or a computing device such as a desktop.

Referring to FIG. 6, the operation of the memory system via firmware includes setting a subject platform (step 71), performing hardware abstraction (step 73), loading a bootable image (step 75), checking an operation status regarding a memory block in a memory device (step 77), and abandoning control and handing over control to a computing device which is associated or engaged with the memory device (step 79).

The setting step of the subject platform (step 71) may be performed by preparing an environment for booting an operating system (OS), thereby confirming whether the subject platform has been initialized. In this step, exact core type and platform should be found and recognized because the same executable image can be performed on different cores or platforms. By way of example but not limitation, the type of core may be stored in the 0th register of a co-processor. The type of platform may be determined by checking whether a specific peripheral device exists or reading information stored in the chip.

In addition, in accordance with an embodiment, in the step 71 of setting the subject platform, diagnostic software may be used to determine whether a hardware component is defective.

In addition, in accordance with an embodiment, in the step 71 of setting the subject platform, any problem of the hardware found through the diagnostic software may be debugged according to debugging code or the like.

The step 73 of hardware abstraction may be performed through a hardware abstract layer (HAL), which is a software layer that hides hardware through a set of defined programming interfaces. By way of example but not limitation, the hardware abstraction layer (HAL) may include software or drivers that enable a processor within the controller 130 to communicate with specific peripheral hardware.

The step 75 of loading a bootable image may include forwarding or executing an operating system or an application program included in the user data area to a host or a computing device that is engaged or associated with the memory system. Operating systems or application programs may be various types, and there may be differences in a way the systems and programs are executed depending on their type. In addition, the firmware functionality may vary depending on a type of media used to store the boot image. For example, a type that stores an operating system or an application program may be a Flash ROM File System (FFS), a binary image, a Common Object File Format (COFS), or an Executable and Linking Format (ELF).

The step 99 of controlling the firmware data relevant block can include the steps of determining data states (data retentions) regarding the firmware block 40_1 and the firmware backup block 40_2 described in FIG. 1, and recovering the firmware block 40_1 and the firmware backup block 40_2 if necessary. For example, the process of recovering the firmware block 40_1 may be performed through the operation described with reference to FIG. 5, and the process of recovering the firmware backup block 40_2 may be performed through the operations of FIGS. 8 and 9.

The step 77 of checking an operation status of a memory block in the memory device is for determining whether the memory system can perform a new program operation which is caused through an internal operation or requested from another device (e.g., a computing device). The operation status regarding the memory block may be checked based on recognized characteristics or types of plural memory blocks included in the memory device. For example, the memory system may estimate the status of each memory block based on parameters or information such as a read count, a program/erase count, a valid page count, etc., which is associated with a plurality of memory blocks included in the memory device. Further, as shown in FIG. 1, an operation status of a corresponding memory block may be recognized through a method of accessing a specific memory block and reading data stored in the specific memory block. In order to reduce repetitive accesses to the specific memory block, a preset amount of dummy data can be programmed in the specific memory block after the memory system accesses the specific memory block in order to recognize or check the operation status of the specific memory block.

The step 79 of handing over (or passing) control to a computing device that is engaged with the memory system may be performed by a boot loader included in the firmware. The step of handing over the control (step 79) may include a step of passing control of the recognized platform from the firmware into the operating system or the application program.

Figure 7:
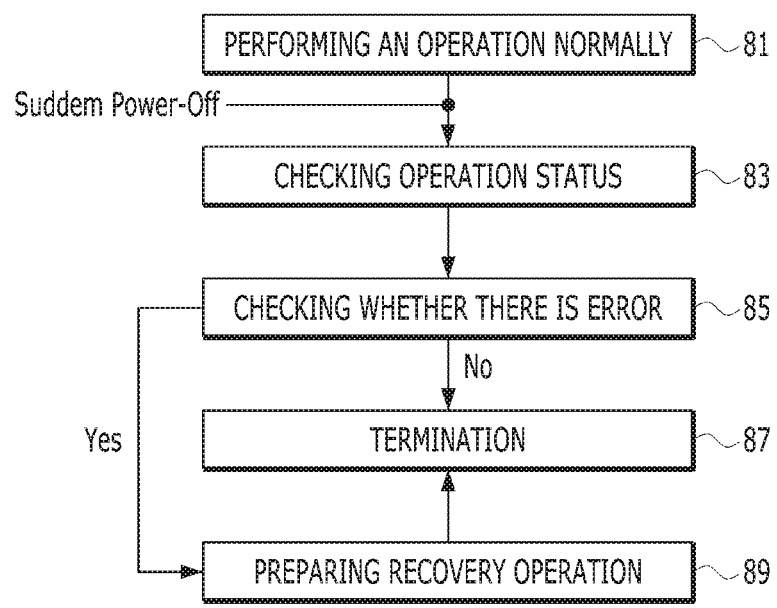
FIGS. 7 and 8 describe recovery operations performed in a memory system in accordance with an embodiment of the disclosure.
Figure 8:
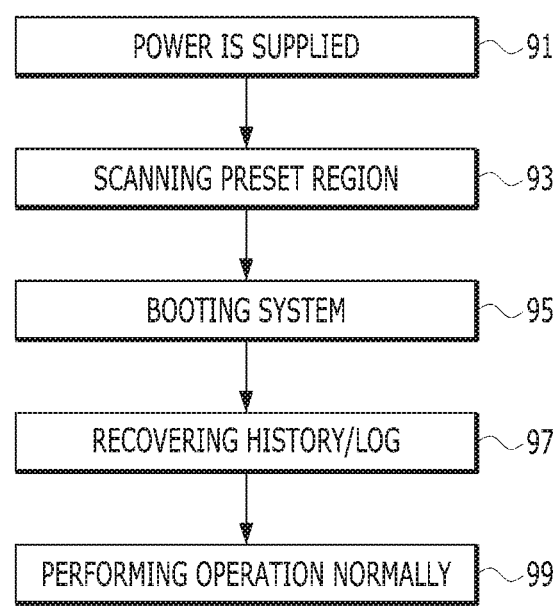

FIGS. 7 and 8 describe recovery operations performed in a memory system in accordance with an embodiment of the disclosure. Specifically, FIG. 7 illustrates a preparation operation of the memory system when power is suddenly interrupted (sudden power-off, SPO). FIG. 8 illustrates a recovery operation of the memory system when the power resumes after SPO.

Referring to FIG. 7, a preparation operation of the memory system may occur when the power is suddenly interrupted (sudden power-off, SPO) while the memory system performs a normal operation (step 81). The preparation operation of the memory system may include checking an operation state of the memory system (step 83) and checking whether there is an error (step 85).

When the power supplied to the memory system is unstable and falls below a predetermined level, the memory system may check an operation status of the memory system (step 83). The memory system may check whether a task requested from another device (for example, a host) that cooperates with each other, or an event corresponding to the task is performed. The operation status of the memory system may include tasks that are already running, tasks to be scheduled, and tasks that have already been executed but are not reported to be completed.

To improve, enhance or ensure operational reliability, the memory system may check whether an error occurs for a task gathered or included through the step of checking the operation status (step 85). The error may include a case in which the operation is not completely performed. For example, when the operation did not complete due to a sudden power off (SPO), the memory system may prepare a recovery operation (step 89). Although not shown, the preparing the recovery operation (step 89) may include configuring logs or history information and storing the log or the history information in a memory device. When the preparation for the recovery operation is done, the memory system may be terminated (step 87).

When the power supplied to the memory system is normally off, or even if the power is suddenly interrupted, it might be possible that no operation is abnormally terminated, or incomplete, when the memory system checks for an error. In such a case, the memory system may be terminated (step 87), without preparation for the recovery operation (step 89).

In an embodiment, the preparation of the memory system described with reference to FIG. 7 to improve the operational reliability may be performed by the controller 130 described with reference to FIGS. 1 to 3.

Referring to FIG. 8, the recovery operation of the memory system may start from receiving the power normally (step 91).

When the power resumes or is supplied to the memory system, the controller may scan a preset region in the memory device (step 93). Herein, the preset region may include an area or a storage space in which system information is stored and/or another area or another storage space in which user data is stored. Examples of system information include firmware, map data, a log, history information, and the like.

In addition, according to an embodiment, a characteristic or a type regarding a plurality of memory blocks included in a memory device may be recognized, and an operation status regarding a memory block may be checked. For example, the memory system may estimate the status of each memory block based on parameters or information (e.g., a read count, a program/erase count, a valid page count, etc.) associated with the plurality of memory blocks included in the memory device. In addition, the preset region may include at least one open memory block, and the operation status of the at least one open memory block may be checked to determine whether the memory device is ready to perform a program operation. For example, as shown in FIG. 1, an operation status regarding an open memory block may be recognized through a method of accessing or reading data stored in the open memory block. To reduce repetitive accesses to the open memory block, a preset amount of dummy data can be programmed in a preset number of pages in the open memory block after accessing the open memory block to check the operation status of the open memory block.

After the memory system scans the preset region (step 93), the controller may load system information such as firmware, map data, a log, history information and the like, stored in the memory device, into a memory in the controller. The memory system may operate based on the system information (step 95).

According to an embodiment, when the memory system has handled or processed all operations normally before the power is off, there may be no recovery operation when the power is supplied again or resumes. However, if the memory system leaves a log or history information through a preparation (for example, see FIG. 7) before the power is off, the memory system may perform the recovery operation based on the log or the history information (step 97). When a status or an operation is restored based on the log or the history information, tasks or events in the log or the history information may be performed so that the memory system may go back to a status before the power was off.

When the memory system is restored to the state before the power is off through the recovery operation based on the log or the history information, the memory system may perform a normal operation requested from an external device (step 99). For example, the external device may include a host which is operatively engaged with the memory system.

In an embodiment, the recovery operation of the memory system may be performed or completed before an operation can be normally performed under a condition that the power is stably supplied. However, when the power supplied to the memory system is unstable and the power is off, the power can be interrupted while the memory system scans a preset region and restores the log or the history information. In this case, the recovery operation of the memory system may be performed repeatedly so that a specific open block can be repeatedly accessed.

However, when a memory block in the memory device is repeatedly accessed in response to a task or an event included in the log or the history information during a recovery operation of the memory system, the last accessed memory block may be recorded. As not shown, when the task or the event included in the log or the history information is not normally completed, a random memory block may be determined as the last accessed block.

In accordance with embodiments described above, a memory system, a data processing system, and an operation method thereof may avoid or reduce to repeat an operation of accessing an open memory block whenever a booting operation or a recovery operation of the memory system is repeatedly performed due to an unstable power supply environment, thereby improving or enhancing stability and reliability of program operation in the memory system.

In addition, embodiments of the disclosure can program a preset amount of dummy data in a specific memory block to reduce disturbance occurring in the specific memory block, thereby reducing an overhead that may occur while the memory system operates.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A method for operating a memory system, comprising:
determining whether a recovery operation is performed, when power is supplied after being interrupted;
generating an internal command for checking an operation status of a memory device when a recovery operation starts;
searching for the at least one open memory block based on a log;
supplying a read voltage to some, not all, of pages in the at least one open memory block to search for a boundary programmed page in the at least one open memory block;
compulsorily programming a preset amount of dummy data on a preset number of blank pages from the boundary programmed page in the at least one open memory block; and
restoring data associated with the recovery operation in the at least one open memory block.

2. The method according to claim 1, further comprising:
outputting the data stored in the at least one page in response to the read voltage.

3. The method according to claim 2, further comprising:
adjusting a level of the read voltage based on the outputted data.

4. The method according to claim 2, wherein the read voltage is supplied sequentially or randomly to the at least one page, or supplied individually to a preset number of pages in the at least one open memory block.

5. The method according to claim 1, wherein the boundary programmed page is the last programmed page in the at least one open memory block, and the blank page is a page, which is erased and not programmed after being erased, in the at least one open memory block.

6. The method according to claim 1, wherein, when a portion of the preset amount of dummy data is programmed on the last page of the at least one open memory block and all of the preset amount of dummy data is not programmed, a remaining portion of the preset amount of dummy data is not programmed on another memory block.

7. The method according to claim 6, wherein the preset amount of dummy data is programmed on the preset number of blank pages which ranges between 10% and 50% of total pages in the at least one open memory block.

8. The method according to claim 1, further comprising:
when the dummy data is programmed on the last page of the at least open memory block, changing the at least one open block into a closed memory block; and
designating at least one free memory block as a new open block which the closed memory block is superseded by.

9. A memory system, comprising:
a memory device including plural non-volatile memory blocks; and
a controller configured to determine whether to perform a recovery operation corresponding to a power interruption when power is supplied,
wherein, after the recovery operation starts, the controller is configured to search for the at least one open memory block based on a log, supply a read voltage to some, not all, of pages in the at least one open memory block to search for a boundary programmed page in the at least one open memory block, compulsorily program a preset amount of dummy data on a preset number of blank pages from the boundary programmed page in the at least one open memory block, and restore data associated with the recovery operation in the at least one open memory block.

10. The memory system according to claim 9, wherein the controller is configured to generate an internal command for checking an operation status of the memory device within a preset time after the power is supplied.

11. The memory system according to claim 10, wherein the controller is configured to output the data stored in the at least one page in response to the read voltage.

12. The memory system according to claim 11, wherein the controller is configured to adjust a level of the read voltage based on the outputted data.

13. The memory system according to claim 11, wherein the read voltage is supplied sequentially or randomly to the at least one page, or supplied individually to a preset number of pages in the at least one open memory block.

14. The memory system according to claim 9, wherein the boundary programmed page is the last programmed page in the at least one open memory block, and the blank page is a page, which is erased and not programmed after being erased, in the at least one open memory block.

15. The memory system according to claim 9, wherein, when a portion of the preset amount of dummy data is programmed on the last page of the at least one open memory block and all of the preset amount of dummy data is not programmed, a remaining portion of the preset amount of dummy data is not programmed on another memory block.

16. The memory system according to claim 15, wherein the preset amount of dummy data is programmed on the preset number of blank pages which ranges between 10% and 50% of total pages in the at least one open memory block.

17. The memory system according to claim 9, wherein the controller is configured to, when the dummy data is programmed on the last page of the at least open memory block, change the at least one open block into a closed memory block, and designate at least one free memory block as a new open block which the closed memory block is superseded by.

18. A method for operating a memory system, comprising:
checking an operation status of at least one open memory block in a memory device when power is supplied; and
determining whether to use the at least one open memory block based on the operation status,
wherein the checking the operation status includes:
searching for the at least one open memory block based on a log;
supplying a read voltage to some, not all, of pages in the at least one open memory block to search for a boundary programmed page in the at least one open memory block; and
compulsorily programming a preset amount of dummy data on a preset number of blank pages from the boundary programmed page in the at least one open memory block.

19. The method according to claim 18, further comprising:
when the dummy data is programmed on the last page of the at least open memory block, changing the at least one open block into a closed memory block; and
designating at least one free memory block as a new open block which the closed memory block is superseded by.

* * * * *